US009553039B2

(12) United States Patent
Cassidy et al.

(10) Patent No.: US 9,553,039 B2
(45) Date of Patent: Jan. 24, 2017

(54) SEMICONDUCTOR DEVICE WITH THROUGH-SUBSTRATE VIA COVERED BY A SOLDER BALL AND RELATED METHOD OF PRODUCTION

(71) Applicant: ams AG, Unterpremstätten (AT)

(72) Inventors: Cathal Cassidy, Okinawa (JP); Martin Schrems, Eggersdorf (AT); Franz Schrank, Graz (AT)

(73) Assignee: AMS AG, Unterpremstaetten (AT)

( * ) Notice: Subject to any disclaimer, the term of this patent is extended or adjusted under 35 U.S.C. 154(b) by 78 days.

(21) Appl. No.: 14/359,568

(22) PCT Filed: Nov. 7, 2012

(86) PCT No.: PCT/EP2012/072060
§ 371 (c)(1),
(2) Date: May 20, 2014

(87) PCT Pub. No.: WO2013/075947
PCT Pub. Date: May 30, 2013

(65) Prior Publication Data
US 2014/0339698 A1    Nov. 20, 2014

(30) Foreign Application Priority Data
Nov. 23, 2011    (EP) .................................... 11190389

(51) Int. Cl.
*H01L 23/48*        (2006.01)
*H01L 23/52*        (2006.01)
(Continued)

(52) U.S. Cl.
CPC ....... *H01L 23/481* (2013.01); *H01L 21/76898* (2013.01); *H01L 24/05* (2013.01);
(Continued)

(58) Field of Classification Search
CPC ............. H01L 24/06; H01L 2224/0401; H01L 23/481; H01L 24/14; H01L 21/76898; H01L 24/05; H01L 24/13; H01L 24/16
(Continued)

(56) References Cited

U.S. PATENT DOCUMENTS 8,378,496 B2*    2/2013 Schrank ............ H01L 21/76898
257/741
2001/0005046 A1    6/2001 Hsuan et al.
(Continued)

FOREIGN PATENT DOCUMENTS

DE    102006040960 A1    12/2007
DE    102007034306 B3    4/2009
(Continued)

*Primary Examiner* — Thien F Tran
(74) *Attorney, Agent, or Firm* — McDermott Will & Emery LLP

(57) ABSTRACT

The semiconductor device comprises a semiconductor substrate (10) with a metallization (111) having an upper terminal layer (22) located at a front side (20) of the substrate. The metallization forms a through-substrate via (23) from the upper terminal layer to a rear terminal layer (13) located opposite to the front side at a rear side (21) of the substrate. The through-substrate via comprises a void (101), which may be filled with air or another gas. A solder ball (100) closes the void without completely filling it. A variety of interconnections for three dimensional integration is offered by this scheme.

6 Claims, 9 Drawing Sheets

(51) Int. Cl.
*H01L 29/40* (2006.01)
*H01L 21/768* (2006.01)
*H01L 23/00* (2006.01)
*H01L 23/552* (2006.01)
*H01L 25/065* (2006.01)

(52) U.S. Cl.
CPC .............. *H01L 24/06* (2013.01); *H01L 24/13* (2013.01); *H01L 24/14* (2013.01); *H01L 24/16* (2013.01); *H01L 23/552* (2013.01); *H01L 25/0657* (2013.01); *H01L 2224/02372* (2013.01); *H01L 2224/0401* (2013.01); *H01L 2224/05548* (2013.01); *H01L 2224/05569* (2013.01); *H01L 2224/05572* (2013.01); *H01L 2224/10125* (2013.01); *H01L 2224/11334* (2013.01); *H01L 2224/11849* (2013.01); *H01L 2224/131* (2013.01); *H01L 2224/136* (2013.01); *H01L 2224/1319* (2013.01); *H01L 2224/13025* (2013.01); *H01L 2224/13027* (2013.01); *H01L 2224/13028* (2013.01); *H01L 2224/1357* (2013.01); *H01L 2224/13561* (2013.01); *H01L 2224/1613* (2013.01); *H01L 2224/16106* (2013.01); *H01L 2224/16225* (2013.01); *H01L 2224/16227* (2013.01); *H01L 2924/00014* (2013.01)

(58) Field of Classification Search
USPC .......................... 257/738, E23.021, 779–781
See application file for complete search history.

(56) References Cited

U.S. PATENT DOCUMENTS

| | | |
|---|---|---|
| 2009/0079021 A1 | 3/2009 | Vogtmeier et al. |
| 2009/0120679 A1 | 5/2009 | Andry et al. |
| 2009/0261457 A1 | 10/2009 | Pratt |
| 2010/0096738 A1 | 4/2010 | Simmons-Matthews et al. |
| 2010/0171209 A1 | 7/2010 | Tanie et al. |
| 2010/0276081 A1 | 11/2010 | Val |
| 2011/0074040 A1 | 3/2011 | Frank et al. |
| 2011/0143535 A1 | 6/2011 | Pares |
| 2011/0169169 A1 | 7/2011 | Reinmuth et al. |

FOREIGN PATENT DOCUMENTS

| | | |
|---|---|---|
| JP | 2005285972 A | 10/2005 |
| KR | 10-2010-0051754 A | 5/2010 |
| KR | 10-2010-0065785 A | 6/2010 |
| WO | 2009/013315 A2 | 1/2009 |
| WO | 2011/056374 A2 | 5/2011 |

\* cited by examiner

SEMICONDUCTOR DEVICE WITH THROUGH-SUBSTRATE VIA COVERED BY A SOLDER BALL AND RELATED METHOD OF PRODUCTION

The invention relates to a semiconductor device having an unfilled through-substrate via or interconnect provided with a solder ball.

In three dimensional integration of semiconductor devices, semiconductor substrates that are provided with structures of integrated circuits, like conductor tracks and electronic circuit components, are stacked and bonded. The conductors that are arranged on different substrates may be connected by through-substrate vias, which are interconnects leading through a substrate. In the case of a silicon substrate these vias are usually designated as through-silicon vias. The via hole in the substrate may be filled with the electrically conductive material or with electrically conductive material and an additional dielectric material.

WO 2009/013315 A2 describes a through-substrate via comprising an unfilled hole in the semiconductor substrate. A terminal contact area surrounds the recess of the via, and a solder ball is deposited so that it closes the recess. In this way a plurality of solder balls may be provided for electric connection, using only a small area of the substrate surface. The diameter of the recess is specified in the range from 50 μm to 500 μm. The solder ball can have a typical dimension of 300 μm to 400 μm side length or diameter.

WO 2011/056374 A2 describes a coaxial through-silicon via.

US 2010/0171209 A1 describes a chip stack comprising gold-plated through-silicon vias, which are interconnected by solder balls provided with a core of a higher melting point. The core, which is adapted to engage in a recess of the via hole, can be copper, tungsten, molybdenum, an insulator or a plastic material.

It is an object of this invention to disclose a new semiconductor device with a through-substrate via that is not filled with solid material and a related method of production.

This object is achieved with the semiconductor device according to claim 1, 2 or 7 and with the method of producing a semiconductor device according to claim 13 or 14. Embodiments and alterations derive from the dependent claims.

The semiconductor device comprises a semiconductor substrate with a metallization and an upper terminal layer located at a front side of the substrate. The metallization forms a through-substrate via from the upper terminal layer to a rear terminal layer located opposite to the front side at a rear side of the substrate. The through-substrate via comprises a void, which may be filled with air or another gas. A solder ball covers or closes the void without completely filling it.

In one aspect the semiconductor device comprises a wiring at the front side. The upper terminal layer may be electrically connected to the wiring and insulated from the solder ball. In other embodiments an upper metal layer, which is separated from the upper terminal layer by an intermetal dielectric, is electrically connected to the wiring, and the solder ball is electrically connected to the upper metal layer. In the latter case the solder ball may be electrically connected to the upper terminal layer as well. Instead, the solder ball may be insulated from the upper terminal layer, which may also be electrically connected to the wiring.

In a further embodiment of the semiconductor device the through-substrate via comprises an annular cavity surrounding a pillar that is formed by a portion of the substrate, and the solder ball is arranged on the pillar.

In a further embodiment a central upper terminal layer is arranged on the pillar and is electrically connected to the metallization and to the solder ball. The pillar is free from the upper terminal layer, which is placed lateral to the area of the through-substrate via.

In a further aspect of the semiconductor device the through-substrate via comprises an annular cavity surrounding a pillar that is formed by a portion of the substrate. The solder ball is arranged on the pillar. A wiring may be arranged at the front side, and the upper terminal layer may be electrically connected to the wiring. The solder ball may be electrically connected to the upper terminal layer, or the solder ball may be insulated from the upper terminal layer.

In an embodiment the pillar is free from the upper terminal layer, and a central upper terminal layer is arranged on the pillar. The solder ball is electrically connected to the central upper terminal layer.

In a further embodiment the metallization is arranged on an outer sidewall of the annular cavity, a central rear terminal layer is arranged at the rear side, and the rear terminal layer is separated from the central rear terminal layer by a dielectric. A further via metallization is arranged on an inner sidewall of the annular cavity and electrically connects the central rear terminal layer with the central upper terminal layer. A wiring may be arranged at the front side, and an upper metal layer, which is separated from the upper terminal layer by an intermetal dielectric, may be electrically connected with the wiring and with the solder ball.

In one aspect of the method of producing a semiconductor device, a semiconductor substrate is provided with a through-substrate via comprising an opening and a via metallization provided with an upper terminal layer located at a front side of the substrate. A metal pad is provided separate from the upper terminal layer of the metallization, and a solder ball is placed on the opening of the through-substrate via. A reflow of the solder ball makes the solder ball electrically contact the metal pad and close the through-substrate via, leaving a void in the through-substrate via.

In a further aspect of the method, a semiconductor substrate is provided with an annular cavity extending from a front side of the substrate to an opposite rear side. Separate metallizations are applied on sidewalls of the annular cavity. A double through-substrate via is thus formed, leaving an opening of the annular cavity at the front side. A solder ball is placed above the opening, and a reflow of the solder ball is effected to form a void of the through-substrate via covered by the solder ball. An electrically conductive pad, which is electrically connected to one of the metallizations and arranged at the front side of the substrate on a pillar formed by a portion of the substrate that is surrounded by the annular cavity, may be electrically contacted by the solder ball.

The following is a detailed description of exemplary embodiments of the semiconductor device and examples of the method of production in conjunction with the accompanying drawings.

Figure 1:
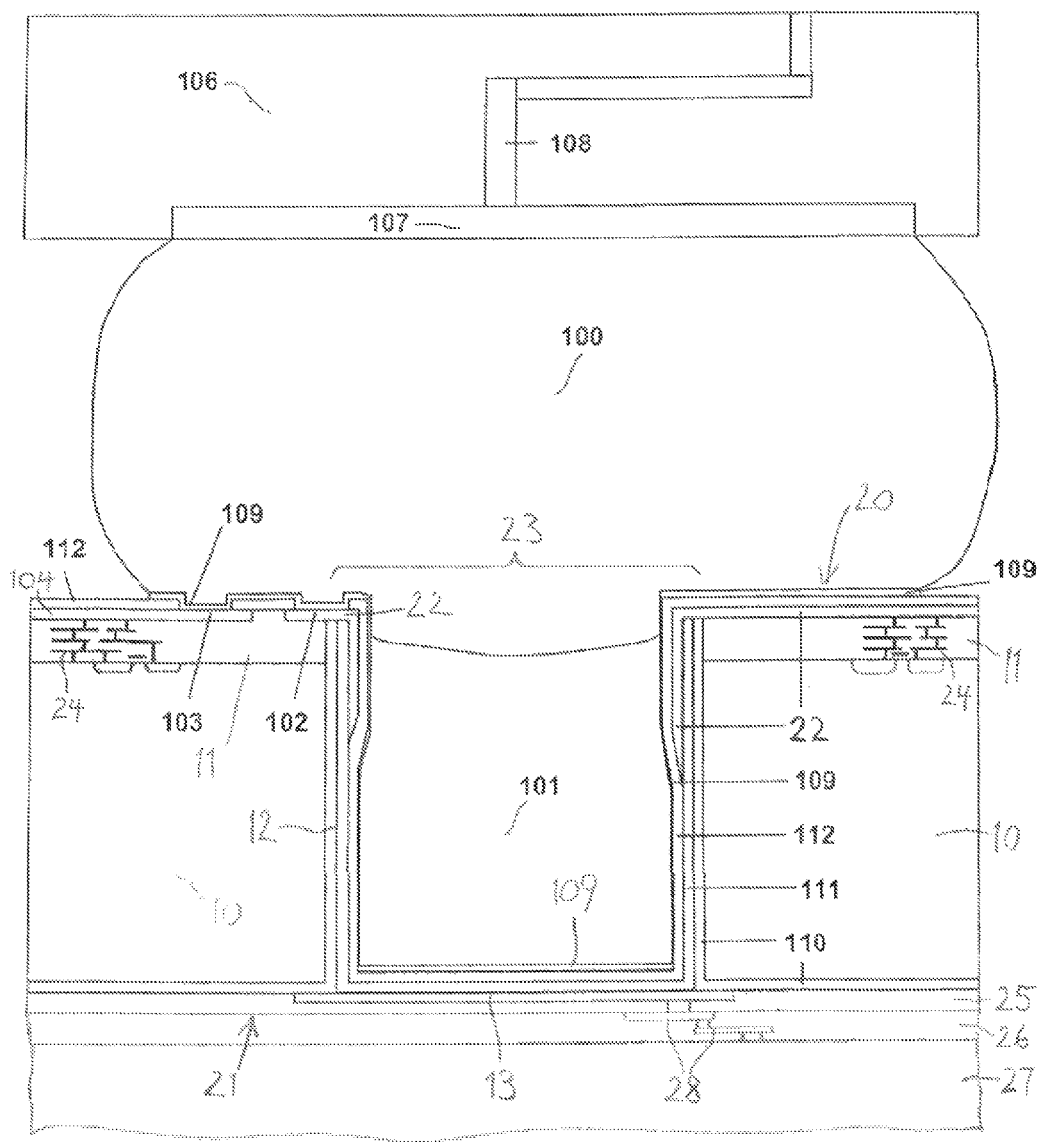
FIG. 1 shows a cross-section of an embodiment of the semiconductor device comprising a via pad.

FIG. 1 shows a cross-section of an embodiment of the semiconductor device in a three dimensionally integrated arrangement. The semiconductor device comprises a semiconductor substrate 10 with an intermetal dielectric 11 at the front side 20. A circuitry may be arranged at the front side 20 and may include active circuit components and a wiring 24 that is embedded in the intermetal dielectric 11. The circuitry can be a CMOS circuit or an ASIC, for example.

A through-substrate via 23 is formed in the substrate 10 by means of a metallization 111, which is arranged at a sidewall 12 of the through-substrate via 23 and is connected with an upper terminal layer 22 and with a rear terminal layer 13 located opposite to the front side 20 at a rear side 21 of the substrate 10. The upper terminal layer 22 may be formed integrally with the metallization 111, or it may be a separate top metallization, which is separately applied so that it is in electrical contact with the metallization 111. The latter case is indicated by way of example in the layer structure shown in FIG. 1.

The rear terminal layer 13 may be arranged in a dielectric 25 at the rear side 21 of the substrate 10. The dielectric 25 may be an oxide of the semiconductor material, for instance. At the rear side 21 of the substrate 10 a further circuitry or device structure may be disposed in a further layer structure of the substrate 10 or on a further substrate 27 that is connected to the rear side 21 of the substrate 10. The further circuitry or device structure may comprise a sensor, for instance. The further substrate 27 may comprise a further wiring 28 in a further intermetal dielectric 26. The rear terminal layer 13 may be connected to the wiring 28, as shown in FIG. 1. The further substrate 27 may comprise any circuitry or device structure, which is therefore not shown in detail.

The through-substrate via 23 is not filled with solid material, and a void 101, which may be filled with air or another gas, is left in the via. The via metallization 111 may be insulated from the substrate 10 by an insulator 110, which is applied at least on the sidewall 12 of the via. The insulator 110 may be an oxide of the semiconductor material. A passivation layer 112 may be applied on the via metallization 111.

A solder ball 100 is arranged on the through-substrate via 23 and closes the void 101. If the sidewall 12 of the through-substrate via 23 is cylindrical and has a diameter of typically about 100 μm, the lateral dimension of the solder ball 100 may be typically about 280 μm. In this embodiment a via pad 102 is located in the upper terminal layer 22. The passivation layer 112 is provided with an opening above the via pad 102, and the solder ball 100 is applied on the via pad 102 in such a manner that it makes an electrical contact with the via pad 102. A metal pad 103 is present in an upper metal layer 104, which is separate from the upper terminal layer 22. The upper terminal layer 22 and the upper metal layer 104 may be insulated from one another by the intermetal dielectric 11. The solder ball 100 electrically contacts the metal pad 103 and thus connects the via pad 102 electrically to the metal pad 103. In this fashion an electrical connection is provided between the wiring 24 and the rear terminal layer 13. The electrical contacts of the solder ball 100 may be effected by means of an underbump metallization 109, which may be applied above the passivation layer 112.

The solder ball 100 may be used for a threedimensional integration with a further substrate 106, which comprises a contact island 107 formed as a metal layer. The further substrate 106 is arranged above the front side 20 of the substrate 10 so that the contact island 107 faces the through-substrate via 23. The substrate 10 and the further substrate 106 may be arranged at a distance of typically about 230 μm, for example. The solder ball 100 electrically contacts the contact island 107, which may be the terminal of a further via 108 of the further substrate 106 or the terminal of a further wiring, for example. In the embodiment according to FIG. 1 the solder ball 100 thus forms electrical connections between the upper terminal layer 22, the metal pad 103 and the contact island 107 of the further substrate 106.

The arrangement according to FIG. 1 can be produced by placing a solder ball on the opening of the through-substrate via 23 and effecting a reflow of the solder ball by increasing the temperature. After the reflow the solder ball 100 has the lenticular shape shown in FIG. 1, electrically contacts the pads 102, 103, and closes the void 101 without filling it. Capillary forces that might draw the solder ball into the opening of the through-substrate via 23 are counteracted by air that is trapped in the void 101. Therefore the solder ball 100 is kept out of the void 101 except for a small lower bulge at most, as indicated in FIG. 1.

The use of a solder ball 100 which simultaneously caps the through-substrate via 23 and makes one or more electrical contacts permits a variable arrangement of interconnects between the circuitries on both sides of the substrate 10 and between the substrates 10, 106. With the solder ball 100 placed above an opening of the via, the substrate area is used economically, and a great number of solder balls 100, typically over a hundred, can easily be arranged above the surface of the substrate 10.

Figure 2:
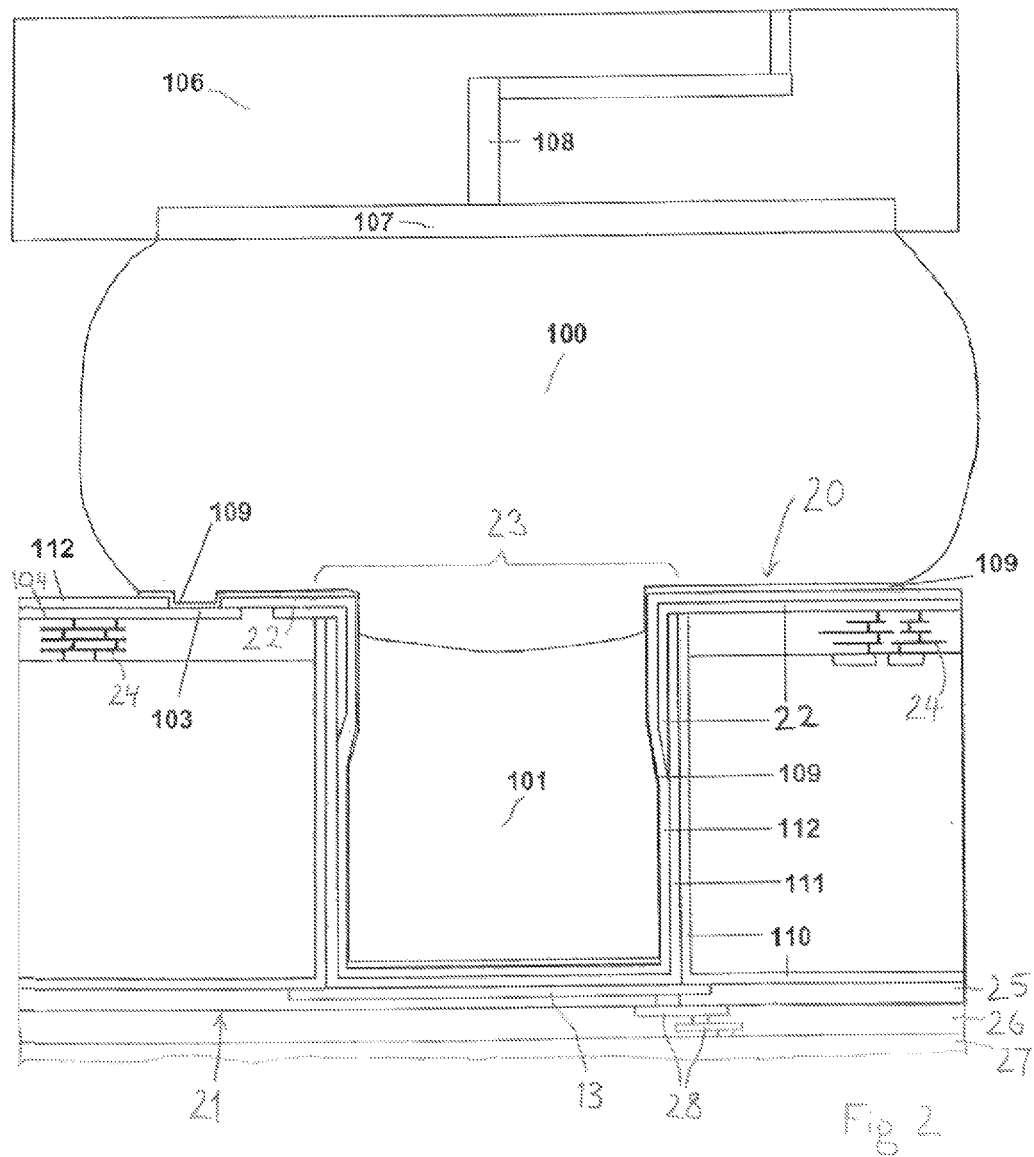
FIG. 2 shows a cross-section of an embodiment having a solder ball that is insulated from the through-substrate via.

FIG. 2 shows a further embodiment in a cross-section according to FIG. 1. The elements that are similar to the corresponding elements of the embodiment according to FIG. 1 are designated with the same reference numerals. The embodiment according to FIG. 2 does not comprise a via pad in the upper terminal layer 22. The upper terminal layer 22 is electrically connected with the wiring 24 shown on the right side in FIG. 2. The solder ball 100 electrically connects the metal pad 103 with the contact island 107 of the further substrate 106. The passivation layer 112 insulates the solder ball 100 from the upper terminal layer 22.

Figure 3:
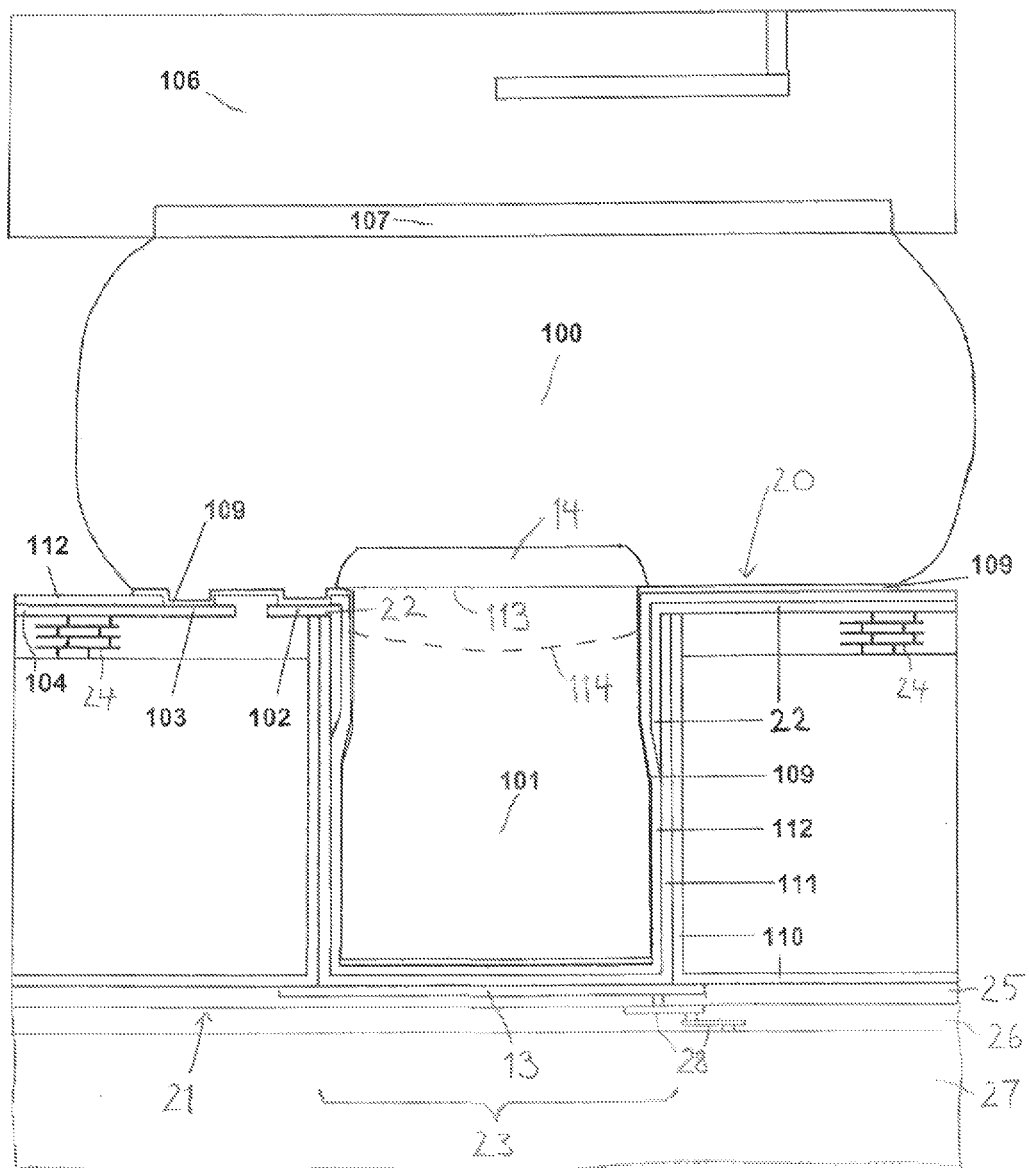
FIG. 3 shows a cross-section of an embodiment comprising a supporting layer.

FIG. 3 shows a further embodiment in a cross-section according to FIG. 1. The elements that are similar to the corresponding elements of the embodiment according to FIG. 1 are designated with the same reference numerals. The embodiment according to FIG. 3 is similar to the embodiment according to FIG. 1 except for a supporting layer 14 carrying the solder ball 100. The lower surface 113 of the supporting layer 14 may be planar. Instead, the lower surface 114 of the supporting layer 14 may bulge into the void 101. The supporting layer 14 may be formed using a dry film like a resist film, for instance. An underbump metallization 109 may be applied under or above the supporting layer 14.

FIG. 3 shows an embodiment having the underbump metallization 109 applied under the supporting layer 14. If the supporting layer 14 is formed before the underbump metallization 109 is applied, a section of the underbump metallization 109 is arranged between the supporting layer 14 and the solder ball 100. The supporting layer 14 may be provided in the embodiment according to FIG. 2 as well.

Figure 4:
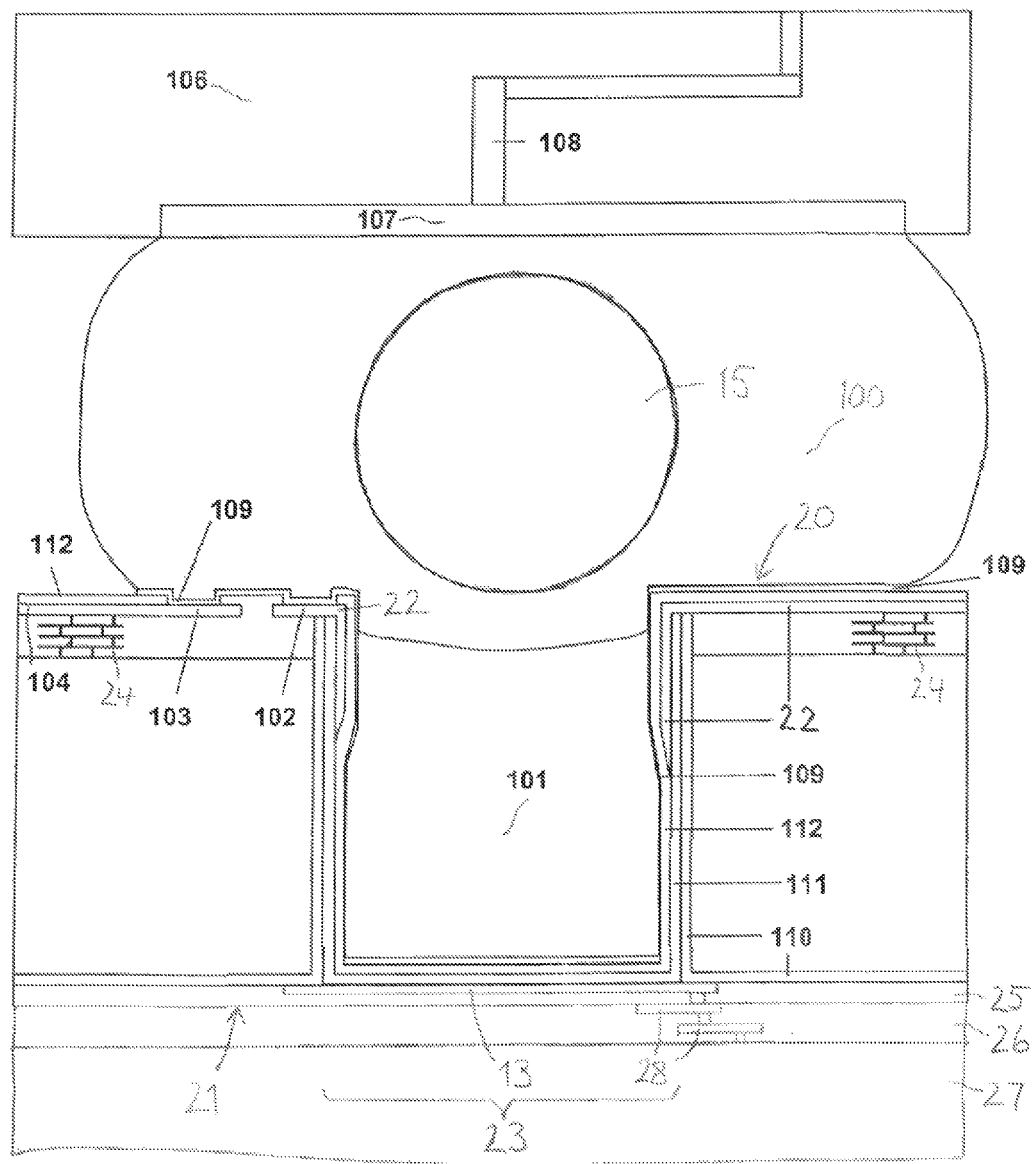
FIG. 4 shows a cross-section of an embodiment comprising a solder ball with a core.

FIG. 4 shows a further embodiment in a cross-section according to FIG. 1. The elements that are similar to the corresponding elements of the embodiment according to FIG. 1 are designated with the same reference numerals. The embodiment according to FIG. 4 is similar to the embodiment according to FIG. 1 except for a core 15 within the solder ball 100. The core 15 of the solder ball 100 has a higher melting point than the rest of the solder ball 100 and helps to stabilize the solder ball 100 during the reflow process. The core 15 can be a polymer, for instance. If the reflow takes place at a temperature that is sufficiently high to melt the solder ball 100 without melting the core 15, the spherical shape of the core of the solder ball 100 is essentially maintained and the alignment of the solder ball 100 with the through-substrate via 23 is facilitated.

Figure 5:
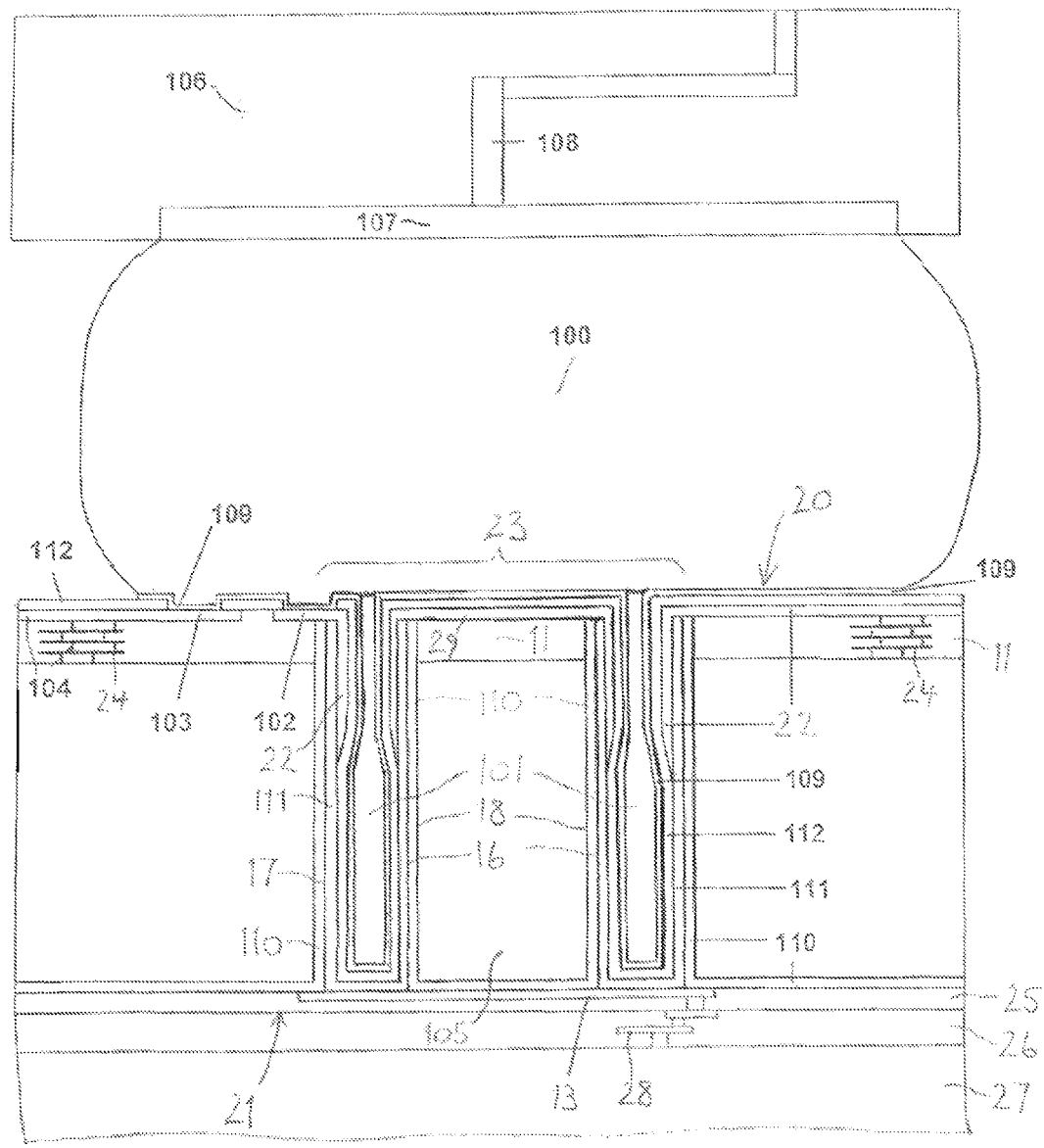
FIG. 5 shows a cross-section of an embodiment comprising an annular cavity.

FIG. 5 shows a further embodiment in a cross-section according to FIG. 1. The elements that are similar to the corresponding elements of the embodiment according to FIG. 1 are designated with the same reference numerals. The embodiment according to FIG. 5 is similar to the embodiment according to FIG. 1 except for the through-substrate via 23 having an annular cavity 18. The via metallization 111 is applied to an inner sidewall 16 and to an outer sidewall 17 of the annular cavity 18 and is connected with the upper terminal layer 22 and the rear terminal layer 13 located at the rear side 21 of the substrate 10. The upper terminal layer 22 comprises a via pad 102, and the metal pad 103 is separate from the upper terminal layer 22. The solder ball 100 electrically contacts the via pad 102 and the metal pad 103 through an underbump metallization 109. By means of the solder ball 100 the via pad 102, the metal pad 103 and the contact island 107 of the further substrate 106 are electrically connected. The annular cavity 18 may have the shape of a cylinder barrel, and the inner sidewall 16 and the outer sidewall 17 may be coaxial cylindrical surfaces. The portion of the substrate 10 that is surrounded by the annular cavity 18 forms a kind of pillar 105, which serves to support the solder ball 100.

Figure 6:
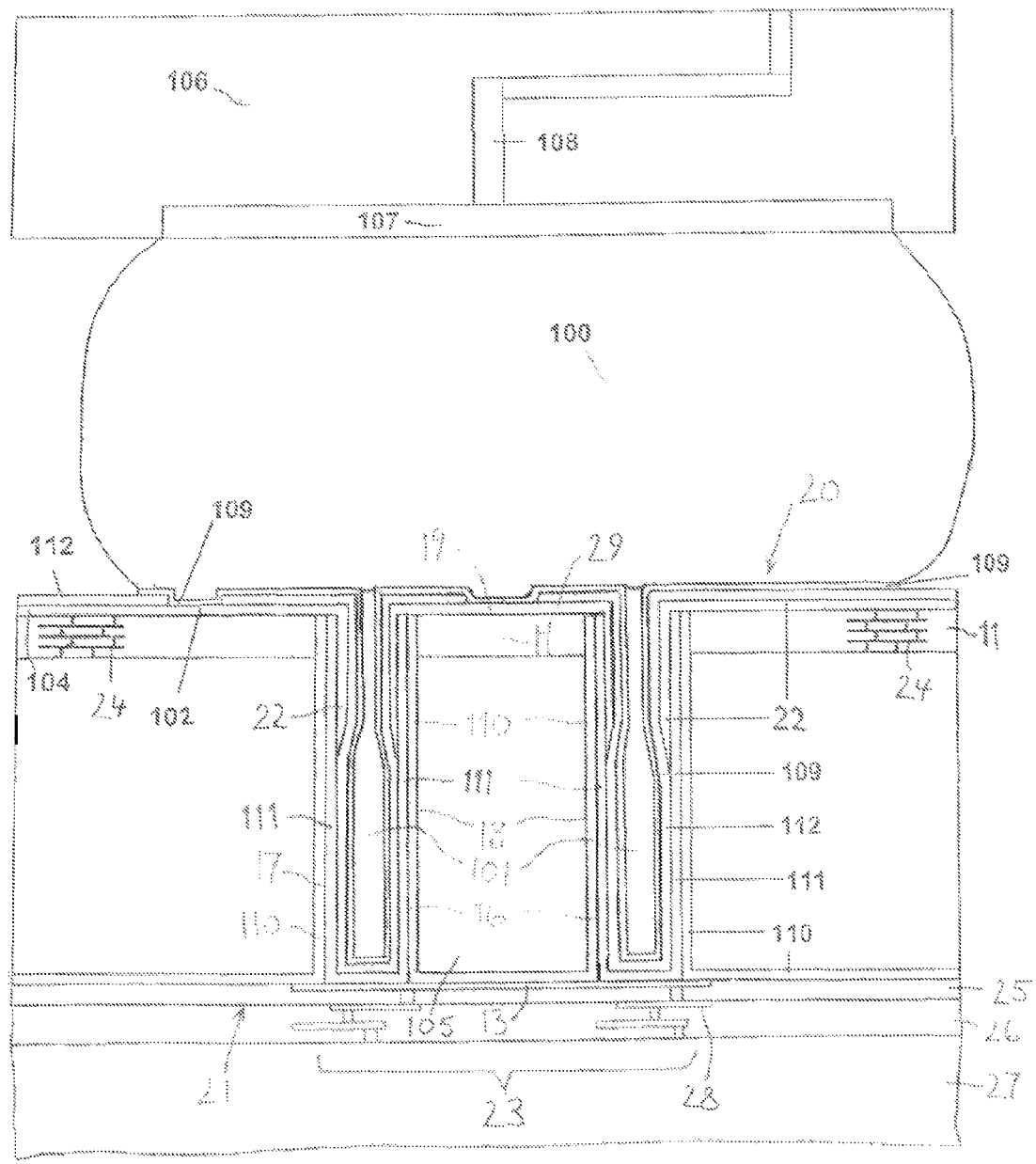
FIG. 6 shows a cross-section of an embodiment comprising an annular cavity, an upper terminal layer connected both to a wiring and to the solder ball, and a central via pad.

FIG. 6 shows a further embodiment in a cross-section according to FIG. 5. The elements that are similar to the corresponding elements of the embodiment according to FIG. 5 are designated with the same reference numerals. The embodiment according to FIG. 6 is similar to the embodiment according to FIG. 5 except for the arrangement of the via pad. A central upper terminal layer 29 comprising a central via pad 19 is located on the pillar 105, the portion of the substrate 10 that is surrounded by the annular cavity 18. The passivation layer 112 comprises an opening above the central via pad 19, and the solder ball 100 electrically contacts the central via pad 19. The passivation layer 112 comprises an opening above the via pad 102, and the solder ball 100 electrically contacts the via pad 102. The upper terminal layer 22 also forms an upper metal layer 104, which is connected with the wiring 24.

The arrangement of the via metallization 111 both on the inner sidewall 16, supplied with a neighboring electrical terminal, which is provided by the central via pad 19, and on the outer sidewall 17, also supplied with a neighboring electrical terminal, which is provided by the via pad 102, has the advantage of a lower resistance compared to the embodiments according to FIGS. 1 to 4.

Figure 7:
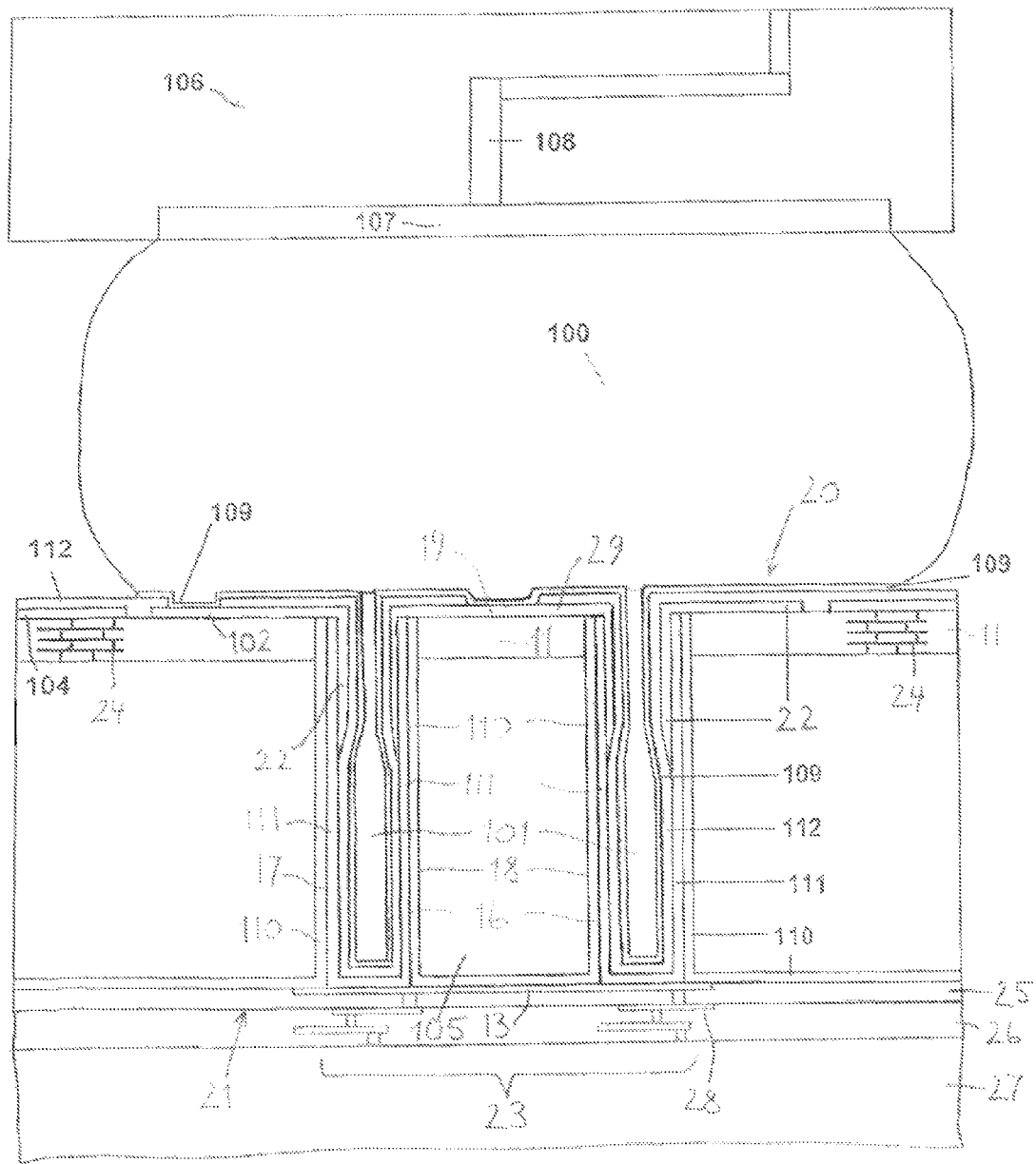
FIG. 7 shows a cross-section of an embodiment comprising an annular cavity, an upper terminal layer that is only connected to the solder ball, and a central via pad.

FIG. 7 shows a further embodiment in a cross-section according to FIG. 6. The elements that are similar to the corresponding elements of the embodiment according to FIG. 6 are designated with the same reference numerals. The embodiment according to FIG. 7 is similar to the embodiment according to FIG. 6 except for the upper metal layer 104 being separate from the upper terminal layer 22 comprising the via pad 102. Therefore the solder ball 100 is not connected with the upper metal layer 104, but only with the via pad 102 and the central via pad 19, thus connecting the metallization 111 only with the contact island 107 of the further substrate 106. The arrangement of the via metallization 111 on the inner sidewall 16 and on the outer sidewall 17 and of respective contacts on the upper terminal layer 22 and the central upper terminal layer 29 has the advantage of a lower resistance of the through-substrate via 23 compared to the embodiments according to FIGS. 1 to 4.

Figure 8:
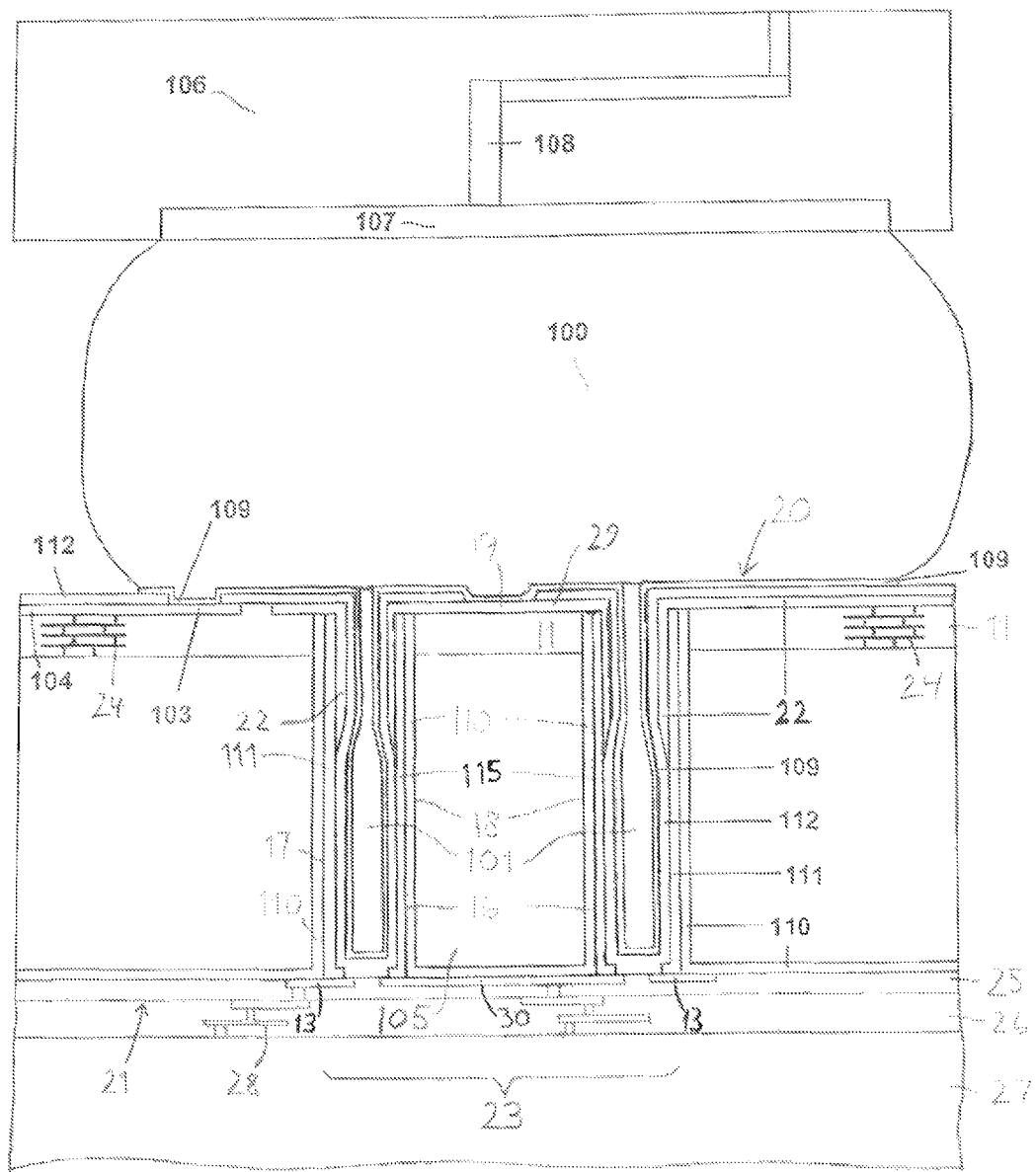
FIG. 8 shows a cross-section of an embodiment comprising an annular cavity with separate portions of the via metallization on sidewalls of the cavity.

FIG. 8 shows a further embodiment in a cross-section according to FIG. 6. The elements that are similar to the corresponding elements of the embodiment according to FIG. 6 are designated with the same reference numerals. The embodiment according to FIG. 8 is similar to the embodiment according to FIG. 6 except for the presence of two separate via metallizations 111, 115 and the contact of the solder ball 100 on the metal pad 103 instead of the via pad 102. An upper terminal of the through-substrate via 23 is provided by the central via pad 19, and the upper terminal layer 22 is separately connected to a part of the wiring 24, which is shown on the right side in FIG. 8. The metal pad 103 is electrically connected with the central via pad 19 only via the solder ball 100. The via metallization 111 that is arranged at the outer sidewall 17 of the annular cavity 18 is insulated from the further via metallization 115 that is arranged at the inner sidewall 16 of the annular cavity 18. The metallization 111 that is arranged at the outer sidewall 17 is electrically connected with the rear terminal layer 13. The further metallization 115 arranged at the inner sidewall is electrically connected with a central rear terminal layer 30, which is arranged at the rear side 21 opposite to the central upper terminal layer 29 at the bottom of the pillar 105. The metallization 111 that is arranged at the outer sidewall 17 is surrounded by dielectric material of the insulator 110 and passivation layer 112 maintaining a floating electric potential if the metallization 111 is not electrically connected to the wiring 24 nor to the further wiring 28. In such a further embodiment the metallization 111 may therefore be used as an electrical shield or screen of the through-substrate via 23, thus rendering a through-substrate via 23 of improved isolation and low capacitance.

Figure 9:
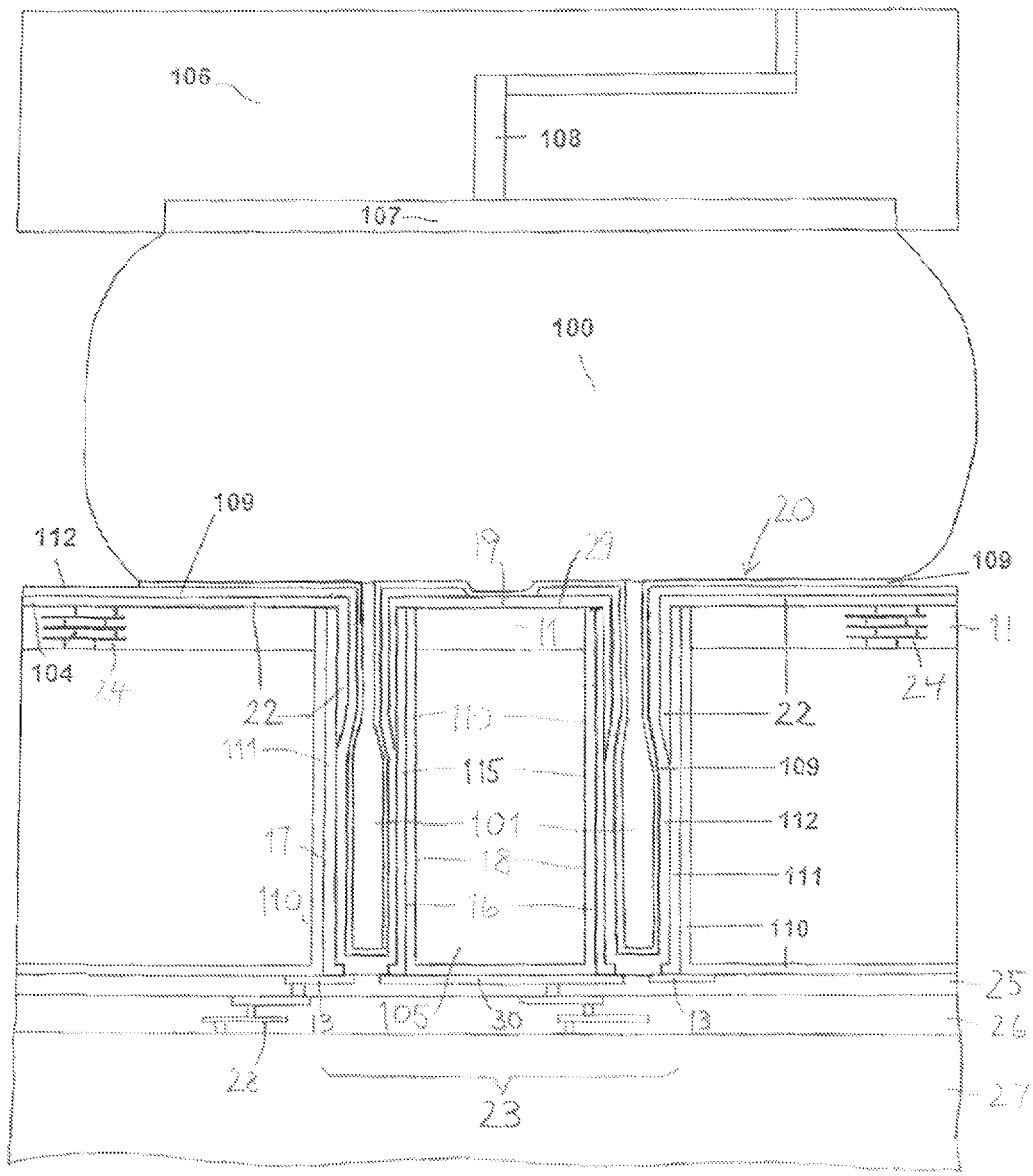
FIG. 9 shows a cross-section of a further embodiment according to FIG. 8.

FIG. 9 shows a further embodiment in a cross-section according to FIG. 8. The elements that are similar to the corresponding elements of the embodiment according to FIG. 8 are designated with the same reference numerals. The embodiment according to FIG. 9 is similar to the embodiment according to FIG. 8 except for an insulation between the solder ball 100 and the upper terminal layer 22. An electrical connection between the via metallization 111 that is arranged at the outer sidewall 17 of the annular cavity 18 and the wiring 24 is realized through the upper terminal layer 22. Because of the electrical connection to the wiring 24 and/or further wiring 28, the via metallization 111 that is arranged at the outer sidewall 17 may be maintained at a defined electric potential. If, instead, the metallization 111 is not electrically connected to the wiring 24 nor to the further wiring 28, the electric potential may be kept floating.

In the embodiment according to FIG. 9, as in the preceding embodiment according to FIG. 8, the via metallizations 111, 115 at the inner and outer sidewalls 16, 17 can be used as separate conductors of a double, especially coaxial through-substrate via 23. The inner conductor of the double through-substrate via 23 is electrically connected to the solder ball 100, by means of the central via pad 19, and to the central rear terminal layer 30. The outer conductor of the coaxial through-substrate via 23 may be electrically connected to the upper wiring 24 and to further conductors of the further wiring 28 and device structures of the further substrate 27, which are not shown in detail.

The embodiments according to FIGS. 5 to 9 have the advantage that the annular cavity 18 improves electrical properties of the through-substrate via 23 and that the portion of the substrate 10 that is surrounded by the annular cavity 18 serves as a mechanical support for the solder ball 100.

In a method of producing the semiconductor device, a semiconductor substrate 10 is provided with a through-substrate via 23 which comprises a via metallization 111 provided with an upper terminal layer 22. The through-substrate via 23 has an opening, which is clad with the metallization 111, which is preferably covered by a passivation layer 112. The upper terminal layer 22 of the via metallization 111 and a metal pad 103 of an upper metal layer 104 that is separate from the upper terminal layer 22 are applied at a front side 20 of the substrate 10. To this end a metal layer may be applied so that it is electrically connected to the via metallization 111 in the opening of the through-substrate via 23. The metal layer is then structured into the upper terminal layer 22 and into a separate further section forming the upper metal layer 104 comprising the metal pad 103. A solder ball is placed on the opening of the through-substrate via 23. Then a reflow of the solder ball is effected in such a way that the solder ball 100 electrically contacts the metal pad 103 and covers the through-substrate via 23, leaving a void 101 in the through-substrate via 23.

When a through-substrate via is to be filled with electrically conductive material, capillary forces serve to draw the solder ball into the opening of the through-substrate via. This result can be avoided if the solder ball is chosen large enough to cover the whole opening of the through-substrate via 23. The air that is trapped in the void 101 prevents the solder from filling the void 101 and allows at most a small lower portion of the solder ball 100, if any, to bulge into the void 101. Additionally a supporting layer 14 may be applied before the solder ball 100 is placed. The supporting layer 14 may be a dry film, especially a dry film resist, which is structured photolithographically to cover the opening of the through-substrate via 23. The supporting layer 14 stabilizes the solder ball 100 mechanically and prevents the solder ball 100 from entering the void 101. Another possibility is the use of a solder ball 100 that is provided with a spherical core 15 of higher melting point. During the reflow of the solder ball 100, the core 15 is not melted and maintains its spherical shape, which is too large to enter the opening of the through-substrate via 23.

In a variant of the method the reflow of the solder ball 100 is effected in such a way that the solder ball 100 electrically contacts at least one via pad 19, 102. For instance, a via pad 102 may be formed in the upper terminal layer 22, and the reflow of the solder ball 100 is effected in such a way that the solder ball 100 electrically contacts the via pad 102. The electrical contacts are improved if an underbump metallization 109 is applied before the solder ball 100.

In a further variant of the method the through-substrate via 23 is formed with an annular cavity 18 in the substrate 10. The use of an annular cavity 18 facilitates the support of the solder ball 100 and prevents a filling of the through-substrate via 23. A central upper terminal layer 29 may be arranged on a pillar 105 formed by the portion of the substrate 10 that is surrounded by the annular cavity 18, and a central via pad 19 may be provided in the central upper terminal layer 29. The reflow of the solder ball 100 is effected in such a way that the solder ball 100 electrically contacts the central via pad 19. In a further variant of the method separate metallizations 111, 115 are applied on sidewalls of the annular cavity 18, thereby forming a double through-substrate via 23.

LIST OF REFERENCE NUMERALS 10 substrate
11 intermetal dielectric
12 sidewall
13 rear terminal layer
14 supporting layer
15 core
16 inner sidewall
17 outer sidewall
18 annular cavity
19 central via pad
20 front side
21 rear side
22 upper terminal layer
23 through-substrate via
24 wiring
25 dielectric
26 further intermetal dielectric
27 further substrate
28 further wiring
29 central upper terminal layer
30 central rear terminal layer
100 solder ball
101 void
102 via pad
103 metal pad
104 upper metal layer
105 pillar
106 further substrate
107 contact island
108 further via
109 underbump metallization
110 insulator
111 via metallization
112 passivation layer
113 lower surface
114 lower surface
115 further via metallization

The invention claimed is:
1. A semiconductor device comprising:
a semiconductor substrate (10) with a front side (20) and an opposite rear side (21),
an upper terminal layer (22) at the front side (20),
a rear terminal layer (13) at the rear side (21),
a through-substrate via (23) comprising a metallization (111) and a void (101), the metallization (111) electrically connecting the rear terminal layer (13) with the upper terminal layer (22),
a solder ball (100), which is arranged above the front side (20) and covers the void (101) without completely filling it, and
a wiring (24) at the front side (20),
characterized in that
the upper terminal layer (22) is electrically connected to the wiring (24) and insulated from the solder ball (100).

2. A semiconductor device, comprising:
- a semiconductor substrate (10) with a front side (20) and an opposite rear side (21),
- an upper terminal layer (22) at the front side (20),
- a rear terminal layer (13) at the rear side (21),
- a through-substrate via (23) comprising a metallization (111) and a void (101), the metallization (111) electrically connecting the rear terminal layer (13) with the upper terminal layer (22),
- a solder ball (100), which is arranged above the front side (20) and covers the void (101) without filling it, and
- a wiring (24) at the front side (20), characterized in that
- an upper metal layer (104), which is separated from the upper terminal layer (22) by an intermetal dielectric (11), is electrically connected to the wiring (24), and
- the solder ball (100) is electrically connected to the upper metal layer (104).

3. The semiconductor device of claim 2, wherein
the upper terminal layer (22) is also electrically connected to the wiring (24) and the solder ball (100) is insulated from the upper terminal layer (22).

4. The semiconductor device of claim 2, wherein
the solder ball (100) is electrically connected to the upper terminal layer (22).

5. The semiconductor device of one of claims 1 to 4, further comprising:
- the through-substrate via (23) comprising an annular cavity (18) surrounding a pillar (105) that is formed by a portion of the substrate (10), and
- the solder ball (100) being arranged on the pillar (105).

6. The semiconductor device of claim 5, further comprising:
- a central upper terminal layer (29) on the pillar (105),
- the central upper terminal layer (29) being electrically connected to the metallization (111) and to the solder ball (100), and
- the pillar (105) being free from the upper terminal layer (22).

* * * * *